(12) United States Patent
Jung et al.

(10) Patent No.: US 11,887,998 B2
(45) Date of Patent: Jan. 30, 2024

(54) MANUFACTURING APPARATUS AND MANUFACTURING METHOD USING THE SAME

(71) Applicant: Samsung Display Co., LTD., Yongin-si (KR)

(72) Inventors: Soo Young Jung, Hwaseong-si (KR); Joon Hyung Kim, Asan-si (KR); Jeong Mok Kim, Asan-si (KR); Chung Hyuk Lee, Hwaseong-si (KR); Sung Jae Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/966,256

(22) Filed: Oct. 14, 2022

(65) Prior Publication Data

US 2023/0037161 A1 Feb. 2, 2023

Related U.S. Application Data

(62) Division of application No. 16/938,426, filed on Jul. 24, 2020, now Pat. No. 11,488,991.

(30) Foreign Application Priority Data

Feb. 7, 2020 (KR) .................. 10-2020-0014935

(51) Int. Cl.
*H01L 27/12* (2006.01)
*H01L 21/67* (2006.01)
(Continued)

(52) U.S. Cl.
CPC .... *H01L 27/1274* (2013.01); *H01L 21/02532* (2013.01); *H01L 21/02592* (2013.01); *H01L 21/02675* (2013.01); *H01L 21/67115* (2013.01); *H01L 21/68735* (2013.01); *H01L 27/1222* (2013.01); *H01L 29/66757* (2013.01); *H01L 29/78675* (2013.01); *H10K 59/1213* (2023.02)

(58) Field of Classification Search
None
See application file for complete search history.

(56) References Cited

U.S. PATENT DOCUMENTS

| 9,496,163 B2 | 11/2016 | Jeon et al. |
| 2017/0033148 A1* | 2/2017 | Liu .................. H01L 21/02667 |
| 2017/0040352 A1 | 2/2017 | Lee et al. |

FOREIGN PATENT DOCUMENTS

| CN | 106133187 | 11/2016 |
| KR | 10-0700821 | 3/2007 |
| WO | 2010/049696 | 5/2010 |

* cited by examiner

*Primary Examiner* — Alexander G Ghyka
(74) *Attorney, Agent, or Firm* — KILE PARK REED & HOUTTEMAN PLLC

(57) ABSTRACT

A manufacturing apparatus and a manufacturing method are provided. A manufacturing apparatus includes a chamber, and a stage disposed in the chamber. The stage includes an upper surface on which a target substrate is disposed, a lower surface opposite to the upper surface, a first side surface extending between the upper surface and the lower surface in a first direction, and a second side surface extending between the upper surface and the lower surface in a second direction perpendicular to the first direction. The first side surface is in a round shape, and at least a portion of the first side surface is convex toward an outside of the stage.

6 Claims, 18 Drawing Sheets

(51) Int. Cl.
*H01L 21/02* (2006.01)
*H01L 29/786* (2006.01)
*H01L 29/66* (2006.01)
*H01L 21/687* (2006.01)
*H10K 59/121* (2023.01)

STU: 40, 50

MANUFACTURING APPARATUS AND MANUFACTURING METHOD USING THE SAME

CROSS-REFERENCE TO RELATED APPLICATION(S)

This is a divisional application based on U.S. patent application Ser. No. 16/938,426, filed Jul. 24, 2020, which issued as U.S. Pat. No. 11,488,991, the disclosure of which is incorporated herein by reference in its entirety. U.S. patent application Ser. No. 16/938,426 claims priority to and benefits of Korean Patent Application No. 10-2020-0014935 under 35 U.S.C. § 119, filed in the Korean Intellectual Property Office on Feb. 7, 2020, the entire contents of which are herein incorporated by reference.

BACKGROUND

1. Technical Field

The disclosure relates to a manufacturing apparatus and a manufacturing method using the same.

2. Description of the Related Art

A pixel driving circuit of a display device includes a thin film transistor using silicon. As silicon forming the thin film transistor, amorphous silicon or polycrystalline silicon may be used.

An amorphous silicon thin film transistor (a-Si TFT) used in the pixel driving circuit may have a low electron mobility of 1 $cm^2/Vs$ or less because a semiconductor active layer constituting the source, drain and channel may be formed of amorphous silicon. Accordingly, recently, the amorphous silicon TFT has tended to be replaced by a polycrystalline silicon TFT (poly-Si TFT). The polycrystalline silicon TFT may have higher electron mobility and superior stability to light irradiation than the amorphous silicon TFT. Thus, the polycrystalline silicon TFT may be suitable for use as an active layer for driving and/or switching thin film transistors in a display device.

Polycrystalline silicon can be manufactured by various methods, which may be largely classified into a method of directly depositing polycrystalline silicon and a method of depositing amorphous silicon and then crystallizing it. In the method of depositing an amorphous silicon thin film and then crystallizing it, the amorphous silicon thin film may be crystallized by a laser beam irradiation method, a heating method or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a manufacturing apparatus capable of improving the efficiency of a process by controlling foreign matter in a chamber and a manufacturing method using the same.

However, embodiments of the disclosure are not restricted to those set forth herein. The above and other embodiments of the disclosure will become more apparent to one of ordinary skill in the art to which the disclosure pertains by referencing the detailed description of the disclosure given below.

An embodiment of a manufacturing apparatus may include a chamber, and a stage disposed in the chamber, the stage including an upper surface on which a target substrate is disposed, a lower surface opposite to the upper surface, a first side surface extending between the upper surface and the lower surface in a first direction, and a second side surface extending between the upper surface and the lower surface in a second direction perpendicular to the first direction. The first side surface may be in a round shape, and at least a portion of the first side surface may be convex toward an outside of the stage.

A slope of a tangent line at an arbitrary point on the first side surface may vary as the arbitrary point moves in the second direction.

An angle between the tangent line and the upper surface at the arbitrary point may increase as the arbitrary point becomes closer to the upper surface in the second direction.

The first side surface may be in a round shape at a portion where the upper surface and the first side surface meet, and an edge may be formed at a portion where the upper surface and the second side surface meet.

An angle between the upper surface and the first side surface may be greater than an angle between the upper surface and the second side surface.

The angle between the upper surface and the second side surface may be a right angle.

The at least a portion of the first side surface may constitute a portion of a circumference of a circle, and a radius of curvature of the circle may be about 25 mm or more.

The stage may further include a third side surface extending between the upper surface and the lower surface in the first direction, the third side surface being opposite to the first side surface, and the third side surface may be in a round shape, and at least a portion of the third side surface may be convex toward an outside of the stage.

The first side surface may be in a round shape at a portion where the third side surface and the upper surface meet.

The first side surface and the third side surface may have a same shape and may be symmetrical with each other.

The second side surface may be in a round shape, and at least a portion of the second side surface may be convex toward an outside of the stage.

The first side surface may be in a round shape at a portion where the first side surface and the upper surface meet, and the second side surface may be in a round shape at a portion where the second side surface and the upper surface meet.

The first side surface may include a first region extended to the upper surface and having in a round shape, and a second region extended to the lower surface and having in a flat shape, and the first region may be in a round shape at a portion where the first region and the upper surface are connected and at a portion where the first region and the second region meet.

The manufacturing apparatus may further include a laser module that irradiates a laser beam toward the target substrate.

An embodiment of a manufacturing method may include disposing a target substrate on a stage inside a chamber, moving the stage, and irradiating a laser beam onto a surface of the target substrate. The stage may include an upper surface on which the target substrate is mounted, a lower surface opposite to the upper surface, a first side surface extending between the upper surface and the lower surface in a first direction, and a second side surface extending between the upper surface and the lower surface in a second direction perpendicular to the first direction. The first side surface may be in a round shape, and at least a portion of the first side surface may be convex toward an outside of the stage.

The target substrate may include an amorphous silicon thin film disposed on the target substrate.

The manufacturing method may further include after the irradiating of the laser beam, crystallizing at least a portion of the amorphous silicon thin film into crystalline silicon.

A slope of a tangent line at an arbitrary point on the first side surface may vary as the arbitrary point moves in the second direction, and an angle between the tangent line and the upper surface at the arbitrary point may increase as the arbitrary point becomes closer to the upper surface in the second direction.

The first side surface may be in a round shape at a portion where the upper surface and the first side surface meet, and an edge may be at a portion where the upper surface and the second side surface meet.

An angle between the upper surface and the first side surface at a portion where the upper surface and the first side surface meet may be greater than an angle between the upper surface and the second side surface at a portion where the upper surface and the second side surface meet.

According to embodiments of the disclosure, it may be possible to provide a manufacturing apparatus capable of improving the efficiency of a process by controlling foreign matter in a chamber and a manufacturing method using the same.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
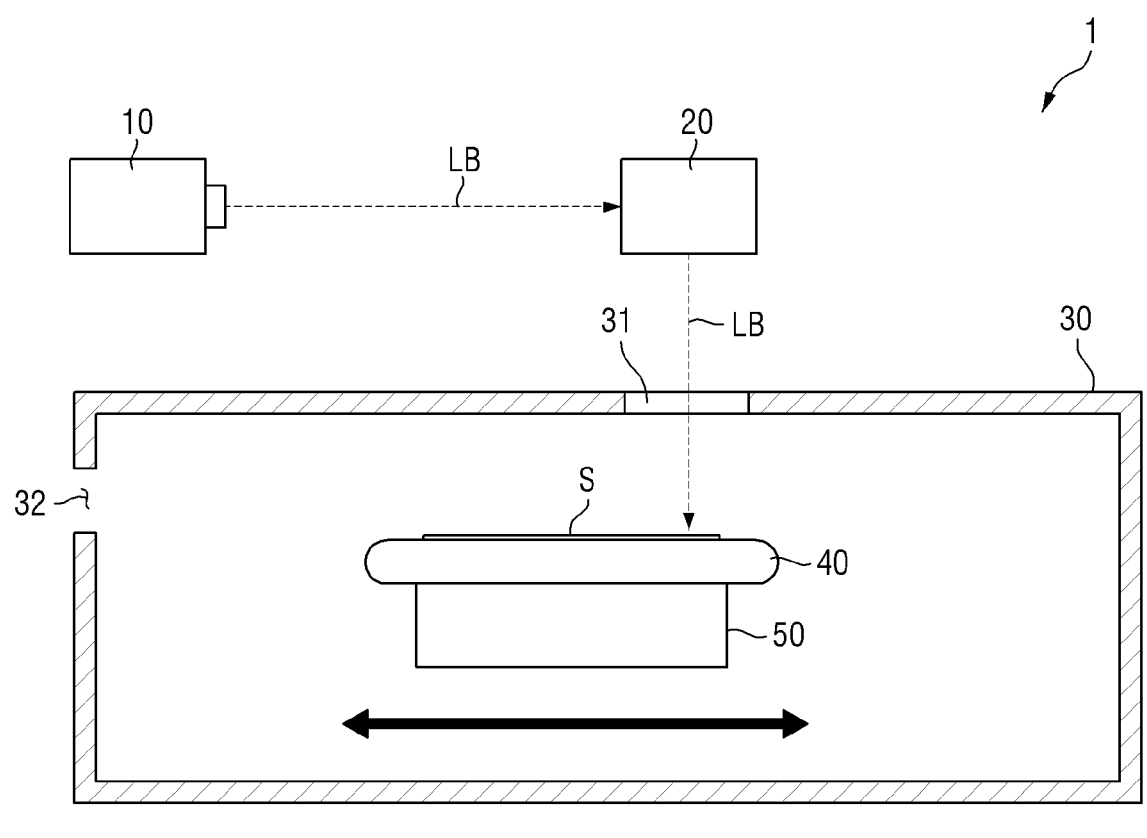
FIG. 1 is a diagram schematically illustrating a manufacturing apparatus according to an embodiment.
Figure 1:
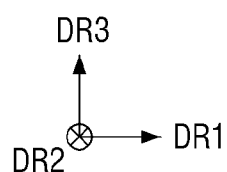

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will also be understood that when a layer is referred to as being "on" another layer or substrate, it can be directly on another layer or substrate, or intervening layers may also be present. The same reference numbers indicate the same components throughout the specification. In the attached figures, the thickness of layers and regions may be exaggerated for clarity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The term overlap may include layer, stack, face or facing, extending over, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the disclosure will be described with reference to the accompanying drawings.

Figure 2:
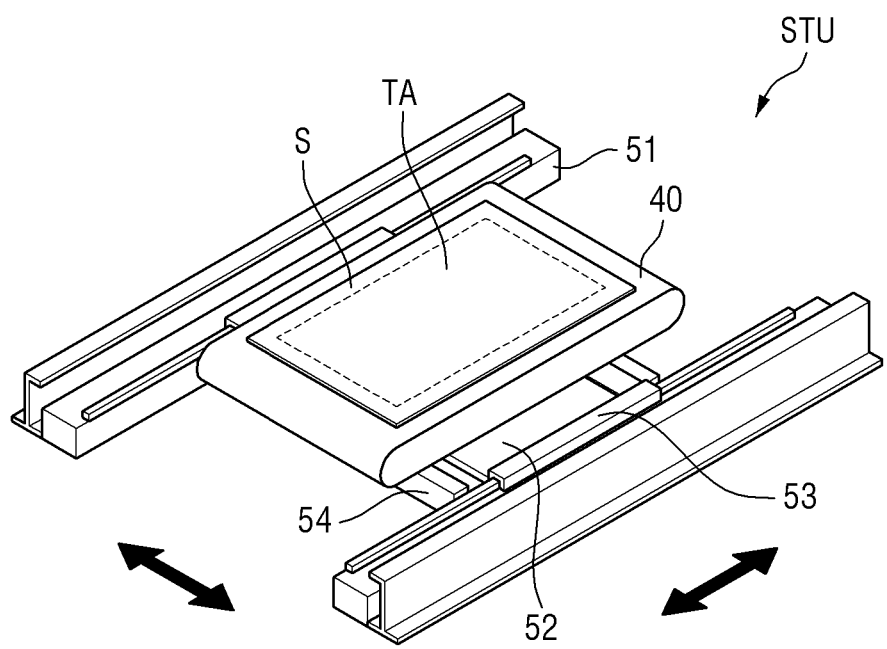
FIG. 2 is a schematic perspective view of a stage and a moving part according to an embodiment.
Figure 2:
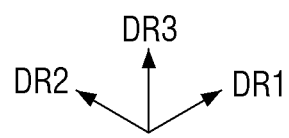
Figure 3:
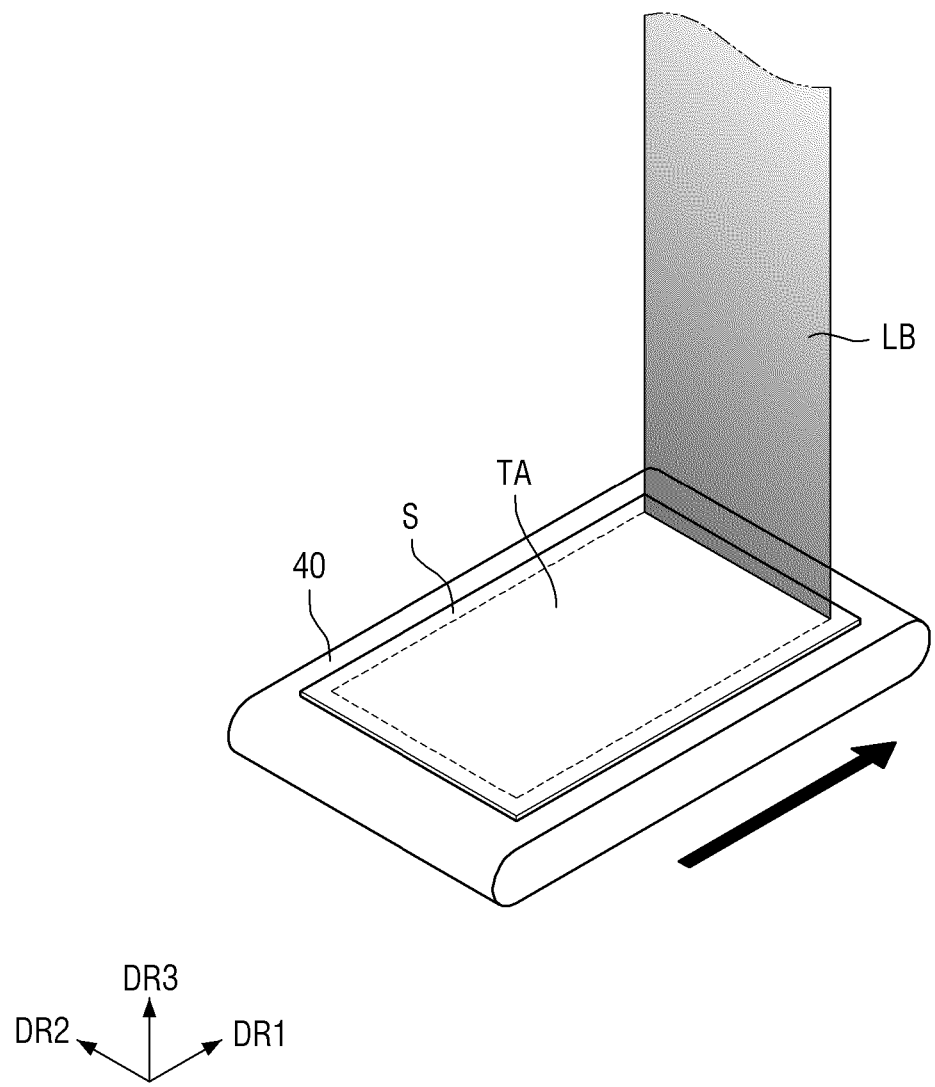
FIG. 3 is a schematic diagram explaining a laser irradiation process according to an embodiment.

FIG. 1 is a diagram schematically illustrating a manufacturing apparatus according to an embodiment. FIG. 2 is a schematic perspective view of a stage and a moving part according to an embodiment. FIG. 3 is a schematic diagram explaining a laser irradiation process according to an embodiment.

Referring to FIGS. 1 to 3, a manufacturing apparatus 1 according to an embodiment may include a laser module 10, an optical system 20, a chamber 30 and a stage part STU. The manufacturing apparatus 1 is an apparatus capable of crystallizing a thin film by irradiating an amorphous thin film on a target substrate S with a laser beam, and an excimer laser annealing (ELA) apparatus will be described as an example. Hereinafter, crystallization of an amorphous silicon thin film deposited on the target substrate S into a crystalline silicon thin film will be described as an example of thin film crystallization, but the disclosure is not limited thereto.

The laser module 10 may emit a laser beam LB capable of crystallizing, particularly, an amorphous silicon thin film in a laser irradiation process. In an embodiment, the laser beam LB may heat the amorphous silicon thin film to a temperature lower than a melting point of the amorphous silicon thin film. In case that the crystalline silicon thin film is crystallized at a temperature lower than the melting point, abnormal protrusions formed at grain boundaries can be reduced, thereby improving crystallinity.

The optical system 20 may allow the laser beam LB emitted from the laser module 10 to reach the target substrate S inside the chamber 30. The optical system 20 may be disposed above the chamber 30 (on one side of a third direction DR3) outside the chamber 30. The optical system 20 may be spaced apart from the chamber 30 by a distance. In the manufacturing apparatus 1 according to an embodiment, a laser irradiation process may be performed while the target substrate S moves along a first direction DR1 in a state where the optical system 20 is fixed.

The chamber 30 may be internally empty, and provide therein a space in which a stage 40, a moving part 50 and the like may be disposed. The chamber 30 may provide a space in which the laser irradiation process is performed. The chamber 30 may have a rectangular parallelepiped shape, but is not limited thereto and may have various shapes. A heat treatment atmosphere and/or a vacuum atmosphere may be formed inside the chamber 30. The chamber 30 may be combined with a heater (not shown) to form a heat treatment atmosphere, and may be combined with a vacuum module (not shown) to form a vacuum atmosphere. The chamber 30 may include a light transmission window 31 and a substrate inlet 32.

The light transmission window 31 may transmit the laser beam LB of a specific wavelength, and allow the laser beam LB emitted from the laser module 10 disposed above the chamber 30 to enter the chamber 30. In other words, the laser beam LB emitted from the laser module 10 disposed outside the chamber 30 may be incident into the chamber 30 through the light transmission window 31. The light transmission window 31 may be disposed on the upper surface of the chamber 30, but is not limited thereto. Although the chamber 30 is illustrated as including one light transmission window 31 in the drawing, the disclosure is not limited thereto and the chamber 30 may include multiple light transmission windows 31. A chamber window protection part (not shown) including a protection window (not shown) for shielding the light transmission window 31 may be further disposed on the upper surface of the chamber 30.

The substrate inlet 32 may allow the target substrate S outside the chamber 30 to enter the chamber 30 or to discharge the target substrate S from the inside of the chamber 30 to the outside. In other words, the target substrate S may pass through the substrate inlet 32 to enter the chamber 30 or may be discharged to the outside of the chamber 30. The substrate inlet 32 may be formed at one side surface of the chamber 30, but is not limited thereto. For example, the chamber 30 may further include, at one side thereof, the substrate inlet 32 through which the target substrate S may be introduced into the chamber 30, and a substrate discharge port (not shown) for discharging to the outside the target substrate S on which the laser irradiation process is completed.

The stage part STU may support the target substrate S and move the target substrate S. The stage part STU may include the stage 40 and the moving part 50.

The stage 40 may be disposed inside the chamber 30. The stage 40 may provide a space in which the target substrate S can be stably placed and may support the target substrate S. In other words, the target substrate S may be mounted on the stage 40. The stage 40 may fix the target substrate S mounted on the stage 40 using a chucking means (not shown). The chucking means (not shown) may fix the target substrate S by using vacuum, static electricity and/or van der Waals force. The stage 40 may move or rotate in a state where the target substrate S may be stably placed, thereby adjusting the position and direction of the target substrate S to which the laser beam is to be irradiated. Accordingly, the laser beam LB emitted from the laser module 10 may reach a desired region of the target substrate S.

Although not shown, the stage 40 may further include a substrate support (not shown) and a rotating shaft guide (not shown) connected to the substrate support (not shown) to rotate the substrate support (not shown). By the rotation of the substrate support (not shown), the target substrate S mounted on the stage 40 may be rotated.

Side surfaces 43a and 43b of the stage 40 (see FIG. 4) disposed on a side and another side of the stage 40 in the first direction DR1 may be rounded to be convex toward the outside of the stage 40. Edges may not be formed at first and second boundaries BD1 and BD2 (see FIG. 4) where an upper surface 41 (see FIG. 4) and the side surfaces 43a and 43b (see FIG. 4) of the stage 40 meet. Accordingly, foreign matter (or particles P and fine particles MP) (see FIGS. 8 to 11) located above the stage 40 can be controlled, and the reliability and yield of the laser irradiation process can be improved. A detailed description thereof will be given later.

The target substrate S may be mounted, as a target of laser irradiation, on the stage 40. Although not shown, the target substrate S may be moved from the outside to the inside of the chamber 30 by a robot arm or the like. An amorphous silicon thin film may be deposited on the target substrate S by another process performed outside the chamber 30 and the target substrate S with the amorphous silicon thin film deposited thereon may be moved into the chamber 30. However, the disclosure is not limited thereto, and the process of depositing the amorphous silicon thin film may be performed in the chamber 30 in which the laser irradiation process may be performed.

The target substrate S may have a smaller area than the stage 40. An edge of the target substrate S may be located in an inner region of the stage 40. For example, the entire area of the target substrate S may overlap the stage 40. Further, the target substrate S may occupy substantially the center of the stage 40.

The target substrate S may constitute, for example, a flat substrate applied to a display device or the like. Examples of the display device may include, but are not limited to, an organic light emitting display device, a micro LED display device, a nano LED display device, a quantum dot light emitting display device, a liquid crystal display device, a plasma display device, a field emission display device, an electrophoretic display device, and an electrowetting display device.

The target substrate S may be a glass substrate or a flexible substrate. The flexible substrate may be any of a polyethylene terephthalate (PET) film, a polypropylene (PP) film, a polyethylene (PE) film, a polyimide (PI) film, a polystyrene (PS) film, a polycarbonate (PC) film, a polyethylene naphthalate (PEN) film, a cyclic olefin copolymer (COC) film, an acryl film, or a combination thereof.

At least one element area TA may be formed on the upper surface of the target substrate S. An amorphous silicon thin film may be deposited on the element area TA. The element area TA may be divided into sub-element areas, which may have a smaller area. However, the disclosure is not limited thereto, and the amorphous silicon thin film deposited on the target substrate S may not be divided into the element area(s) TA, and the entire target substrate S may be formed as the element area TA. For example, the amorphous silicon thin film may be deposited on the entire area of the target substrate S.

The amorphous silicon thin film deposited on the target substrate S may be crystallized by the laser beam LB emitted from the laser module 10. The laser beam LB may be irradiated in a line form onto the target substrate S. While the laser beam LB is irradiated, the target substrate S may be moved horizontally in a direction (e.g., the first direction DR1) perpendicular to the line of the laser beam LB by the stage 40 and/or the moving part 50. Accordingly, the laser beam LB may be irradiated onto the entire surface of the target substrate S. Thus, the amorphous silicon thin film may be crystallized into a crystalline silicon thin film over the entire surface of the target substrate S and/or the entire surface of the element area TA.

The target substrate S on which the crystallization step may be completed may be returned to the horizontal movement (e.g., in the first direction DR1) by the stage 40 and/or the moving part 50, and discharged to the outside of the chamber 30 through the substrate inlet 32.

After the amorphous silicon thin film may be crystallized, various elements necessary for operating the flat panel display device may be implemented in the element area TA. Various elements formed in the target substrate S and the element area TA may form a flat substrate of the display device.

The moving part 50 may be disposed below the stage 40. The moving part 50 may be combined with the stage 40 to move the stage 40 in the first direction DR1 and/or a second direction DR2. The moving part 50 may include a first moving member 51, a second moving member 52, a sliding member 53 and a cable duct 54.

The first moving member 51 may extend in the first direction DR1 and may be implemented as a pair of two rails spaced apart from each other. The first moving member 51 may move the second moving member 52, the stage 40 and the substrate S mounted on the stage 40 to a side and another side in the first direction DR1.

The second moving member 52 may be disposed between the first moving members 51. The second moving member 52 may extend in the second direction DR2 and may connect the pair of first moving members 51. The second moving member 52 moves to a side and another side in the first direction DR1 along the first moving members 51. The second moving member 52 may move the stage 40 to a side and another side in the second direction DR2 by an air bearing (not shown) provided on the lower surface thereof.

The second moving member 52 may move in the first direction DR1 along the first moving member 51, and the stage 40 located above the second moving member 52 may move in the second direction DR2 along the second moving member 52. In other words, the stage 40 may move in the second direction DR2 as well as the first direction DR1 by the first moving member 51 and the second moving member 52. Thus, the target substrate S mounted on the stage 40 may be located at an appropriate position through the above-described horizontal rotational movement of the substrate support (not shown) in not only the first direction DR1 but also the second direction DR2 during the laser irradiation process.

The sliding member 53 may extend from the second moving member 52 to be connected to the first moving member 51. The sliding member 53 may be implemented as a pair of members spaced apart from each other. The sliding member 53 allows the second moving member 52 to move along the first moving member 51 to a side and another side in the first direction DR1.

The cable duct 54 may be disposed between the pair of sliding members 53. The cable duct 54 may be a cable protection housing that may collect cables for supplying various control currents to the first and second moving members 51 and 52 of the stage 40. The cable duct 54 may be connected by the sliding member 53 to move along with the movement of the sliding member 53.

In case a second moving member bearing (not shown), a stage bearing (not shown) and the substrate support (not shown) provided in the moving part 50 are mechanically operated, splittable foreign matter (or particles P and fine particles MP (see FIGS. 8 to 11)) may be generated, which may cause a process failure. Further, in a process of loading the target substrate S into the chamber 30, external foreign matter (or particles P and fine particles MP (see FIGS. 8 to 11)) may enter the chamber 30.

Hereinafter, the stage 40 for controlling such foreign matter will be described in detail.

Figure 4:
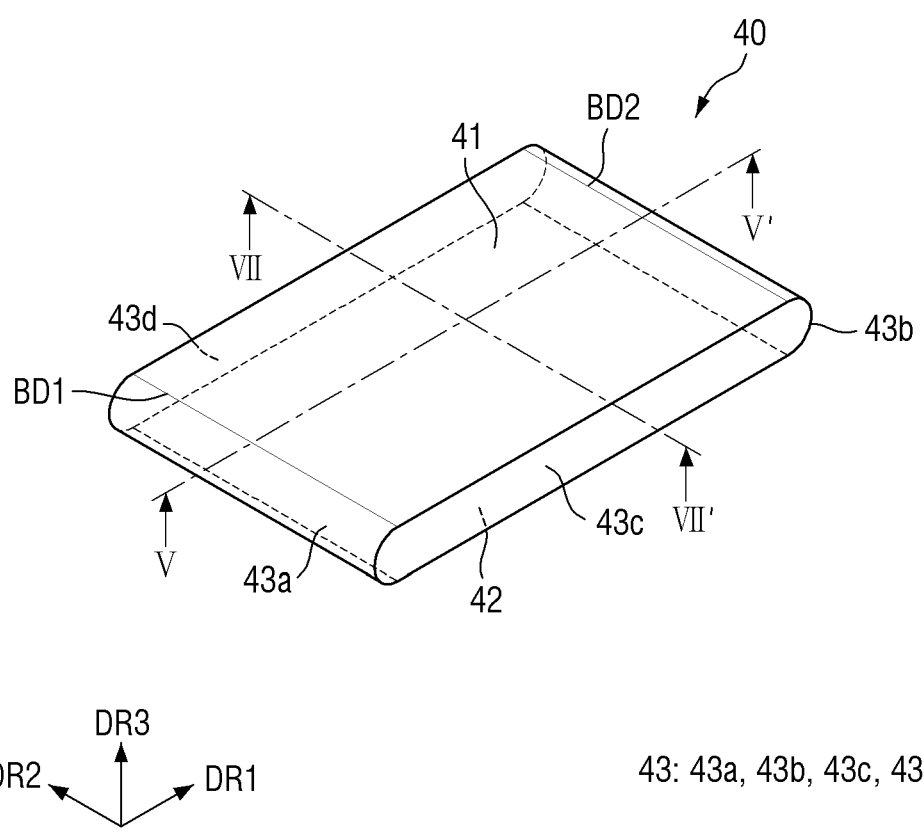
FIG. 4 is a schematic perspective view of a stage according to an embodiment.
Figure 5:
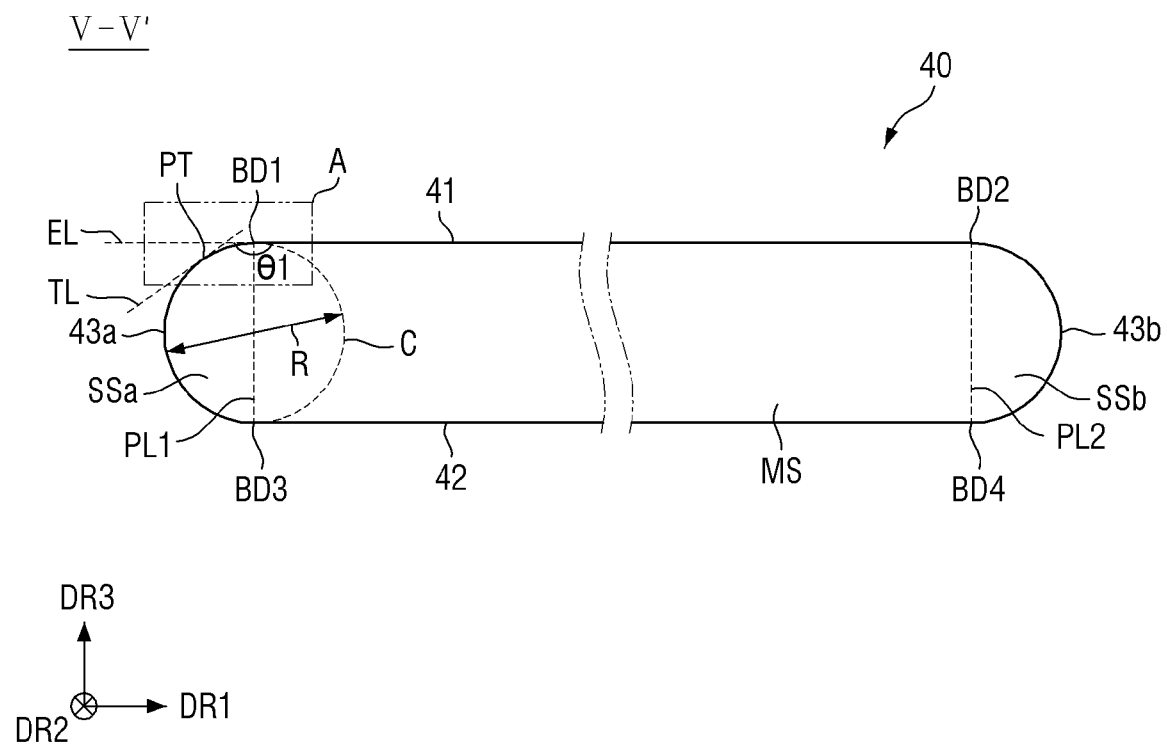
FIG. 5 is a schematic cross-sectional view taken along line V-V of FIG. 4.
Figure 6:
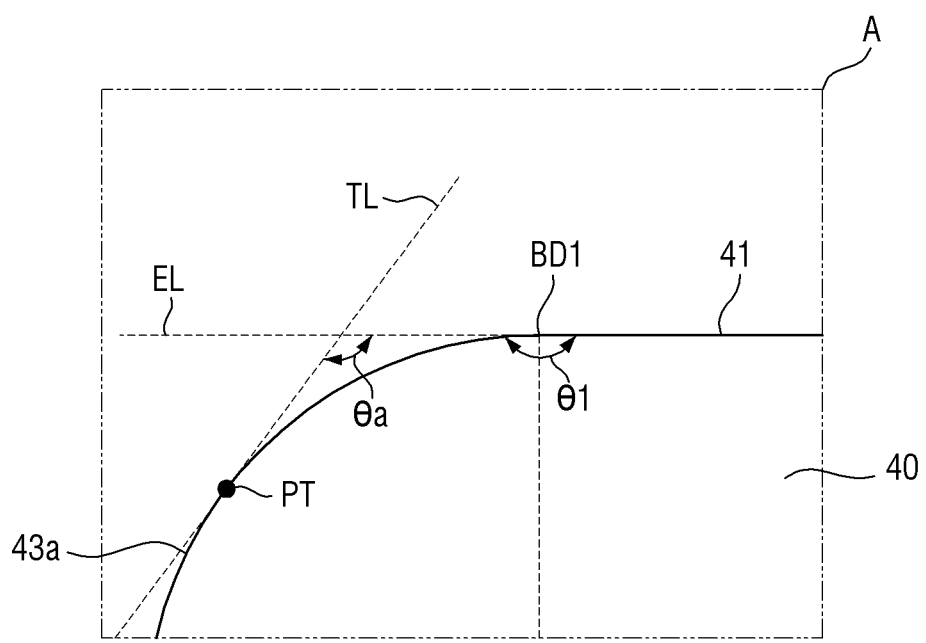
FIG. 6 is an enlarged schematic view of region A of FIG. 5.
Figure 7:
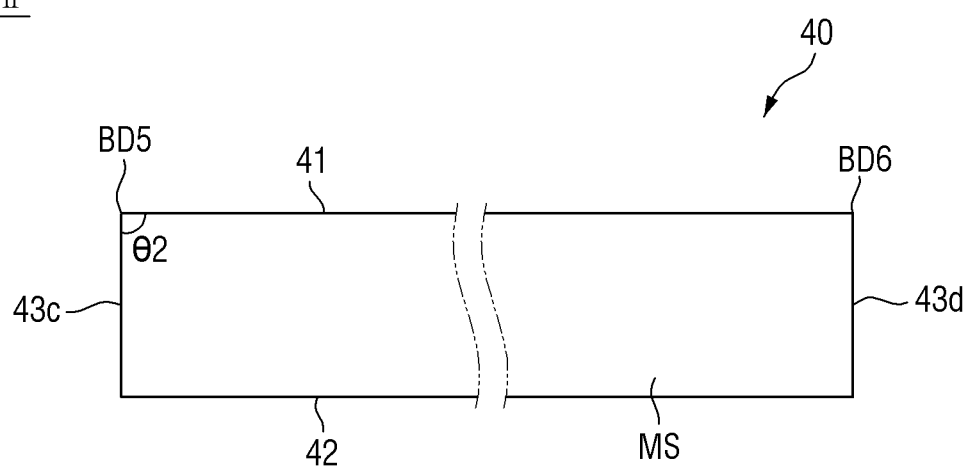
FIG. 7 is a schematic cross-sectional view taken along line VII-VII' of FIG. 4.
Figure 7:
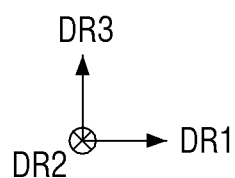

FIG. 4 is a schematic perspective view of a stage according to an embodiment. FIG. 5 is a schematic cross-sectional view taken along line V-V of FIG. 4. FIG. 6 is an enlarged schematic view of region A of FIG. 5. FIG. 7 is a schematic cross-sectional view taken along line VII-VII' of FIG. 4.

Referring to FIGS. 4 to 7, the stage 40 may include an upper surface 41, a lower surface 42 opposite to the upper surface 41, and side surfaces 43 extending to the upper surface 41 and the lower surface 42.

The upper surface 41 may be a portion on which the target substrate S may be mounted and may be a surface facing the target substrate S. The upper surface 41 may face not only the target substrate S but also the light transmission window 31 (see FIG. 1). The upper surface 41 may be located above the lower surface 42 (on one side of the third direction DR3). The upper surface 41 may be formed in a substantially flat shape.

The lower surface 42 may be a surface opposite to the upper surface 41 and may face the moving part 30 disposed below the stage 40. The lower surface 42 may be located above the upper surface 41 (on another side of the third direction DR3). The lower surface 42 may be formed in a substantially flat shape. Although not limited thereto, the shape and size of the lower surface 42 may be the same as the shape and size of the upper surface 41, and the lower surface 42 may overlap the upper surface 41 in the third direction DR3.

The side surfaces 43 may extend the upper surface 41 to the lower surface 42. The side surfaces 43 may include a first side surface 43a, a second side surface 43b, a third side surface 43c, and a fourth side surface 43d. The first side surface 43a refers to a portion located on one side of the stage 40 in the first direction DR1 and extending in the second direction DR2. The second side surface 43b refers to a portion located on another side of the stage 40 in the first direction DR1 and extending in the second direction DR2. The third side surface 43c refers to a portion located on one side of the stage 40 in the second direction DR2 and extending in the first direction DR1. The fourth side surface 43d refers to a portion located on another side of the stage 40 in the second direction DR2 and extending in the first direction DR1.

Among the four side surfaces 43a, 43b, 43c and 43d, the side surfaces (e.g., the first side surface 43a and the second side surface 43b) disposed on a side and another side of the stage 40 in the moving direction (e.g., the first direction DR1) may be formed in a round shape. In other words, among the four side surfaces 43a, 43b, 43c and 43d, the side surfaces (e.g., the first side surface 43a and the second side surface 43b) extending in a direction (e.g., the second direction DR2) perpendicular to the moving direction (e.g., the first direction DR1) of the stage 40 may be formed in a round shape. The side surfaces (e.g., the first side surface 43a and the second side surface 43b) may be formed in a convex shape toward the outside of the stage 40. Further, among the four side surfaces 43a, 43b, 43c and 43d, the side surfaces (e.g., the third side surface 43c and the fourth side surface 43d) extending in the moving direction (e.g., the first direction DR1) of the stage 40 may be formed in a substantially flat shape.

Specifically, the first side surface 43a and the second side surface 43b may extend from the upper surface 41 to the outside of the stage 40 and may be curved to be extended to the lower surface 42. For example, the first side surface 43a and the second side surface 43b may connect the two surfaces 41 and 42 between the upper surface 41 and the lower surface 42. The first side surface 43a and the second side surface 43b may be formed as a portion of the circumference of circle C in cross-sectional view. For example, each of the first side surface 43a and the second side surface 43b may be formed as half of the circumference of the circle C, i.e., the circumference of a semicircle. However, the disclosure is not limited thereto, and the first side surface 43a and the second side surface 43b may be formed as a portion of the circumference of, e.g., an ellipse in cross-sectional view.

The first side surface 43a and the second side surface 43b may be symmetric with each other, may be formed in the same shape, and may include the same curvature. Although not limited thereto, the length of a diameter R of the circle C may be about 30 mm or more or about 50 mm or more. For example, the radius of curvature of the circle C may be about 15 mm or more or about 25 mm or more. In case that each of the first side surface 43a and the second side surface 43b is formed as half of the circumference of the circle C, i.e., the circumference of the semicircle, the length of the diameter R of the circle C may be equal to the thickness (width in the third direction DR3) of the stage 40.

Portions where the first side surface 43a and the second side surface 43b meet the upper surface 41 may be referred to as a first boundary BD1 and a second boundary BD2, respectively. Portions where the first side surface 43a and the second side surface 43b meet the lower surface 42 may be referred to as a third boundary BD3 and a fourth boundary BD4, respectively. The first side surface 43a and the second side surface 43b may be rounded at the first boundary BD1 and the second boundary BD2. The stage 40 may not have edges formed at the first boundary BD1 and the second boundary BD2. Although not limited thereto, in the stage 40, the first side surface 43a and the second side surface 43b may be rounded at the third boundary BD3 and the fourth boundary BD4.

In other words, in cross-sectional view, a slope of an imaginary tangent line TL in contact with an arbitrary point PT located on the first side surface 43a may vary continuously as the arbitrary point PT moves toward the first boundary BD1. Further, an angle θa between the imaginary tangent line TL in contact with the arbitrary point PT located on the first side surface 43a in the cross section and an imaginary extension line EL extending from the upper surface 41 may increase continuously as the arbitrary point PT approaches the first boundary BD1 from the outermost point of the first side surface 43a. When the arbitrary point PT reaches the first boundary BD1, the angle θa may converge to about 180°. The angle θa refers to an obtuse angle formed between the imaginary extension line EL and the imaginary tangent line TL at the arbitrary point PT located on the first side surface 43a in a region between the first boundary BD1 and the outermost point of the first side surface 43a. In the above description, the first boundary BD1 and the first side surface 43a have been described, but the above description may also be applied to the second boundary BD2 and the second side surface 43b.

Portions where the third side surface 43c and the fourth side surface 43d meet the upper surface 41 may be referred to as a fifth boundary BD5 and a sixth boundary BD6, respectively. At the fifth boundary BD5 where the third side surface 43c and the upper surface 41 meet, an angle θ2 between the third side surface 43c and the upper surface 41 may be smaller than an angle θ1 between the first side surface 43a and the upper surface 41 at the first boundary BD1 where the first side surface 43a and the upper surface 41 meet. Although not limited thereto, the angle θ2 between the third side surface 43c and the upper surface 41 at the fifth boundary BD5 may be a right angle. In the above description, the fifth boundary BD5 and the third side surface 43c have been described, but the above description may also be applied to the sixth boundary BD6 and the fourth side surface 43d.

The stage 40 may further include a main part MS, a first sub-part SSa located on one side of the main part MS in the first direction DR1, and a second sub-part SSb located on another side of the main part MS in the first direction DR1. Hereinafter, an imaginary plane extending from the first boundary BD1 to the third boundary BD3 at the shortest distance is referred to as a first imaginary plane PL1, and an imaginary plane extending from the second boundary BD2 to the fourth boundary BD4 at the shortest distance is referred to as a second imaginary plane PL2.

The main part MS may be a part on which the target substrate S is mounted, and may be a region located between the first imaginary plane PL1 and the second imaginary plane PL2. The upper surface 41 of the main part MS may correspond to the upper surface 41 of the stage 40, and the lower surface 42 of the main part MS may correspond to the lower surface 42 of the stage 40.

The first sub-part SSa and the second sub-part SSb may be regions protruding from the main part MS on a side and another side of the main part MS in the first direction DR1. In other words, the first sub-part SSa may be a part disposed outside the main part MS with respect to the first imaginary plane PL1, and the second sub-part SSb may be a part disposed outside the main part MS with respect to the second imaginary plane PL2. For example, the main part MS, the first sub-part SSa and the second sub-part SSb may be divided by the first imaginary plane PL1 and the second imaginary plane PL2. The outer side surface 43a of the first sub-part SSa may correspond to the first side surface 43a of the stage 40, and the outer side surface 43b of the second sub-part SSb may correspond to the second side surface 43b of the stage 40.

In the drawing, the main part MS, the first sub-part SSa and the second sub-part SSb are illustrated as being integrally formed, but the disclosure is not limited thereto.

Since the stage 40 may have no edge at the first boundary BD1 and the second boundary BD2 where the upper surface 41 of the stage 40 meets the first side surface 43a and the second side surface 43b, and the first side surface 43a and the second side surface 43b are formed in a round shape, due to the Coanda effect, it is possible to control the flow of foreign matter (or particles P and fine particles MP (see FIGS. 8 to 11)). A detailed description thereof will be made with reference to FIGS. 8 to 11.

Figure 8:
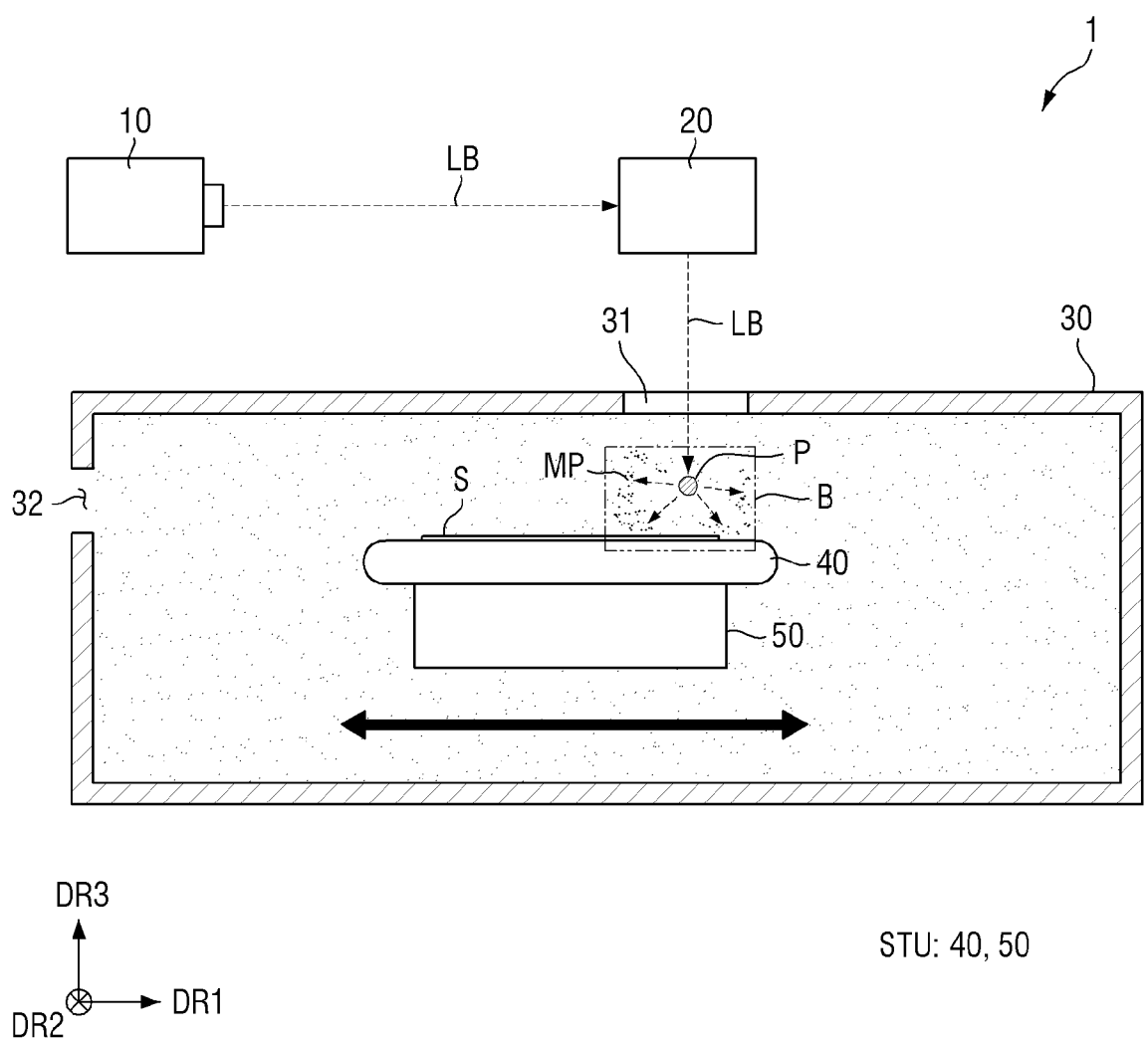
FIG. 8 is a view schematically showing particles and fine particles located inside a chamber.
Figure 9:
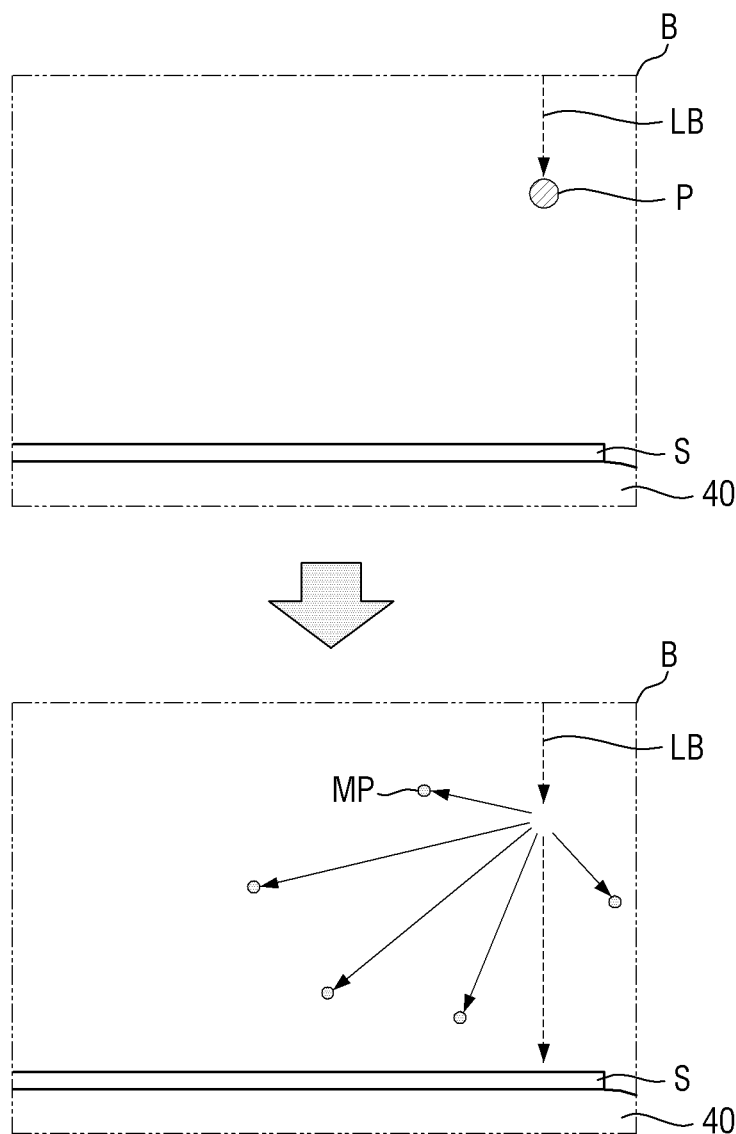
FIG. 9 is an enlarged schematic view of region B of FIG. 8.
Figure 10:
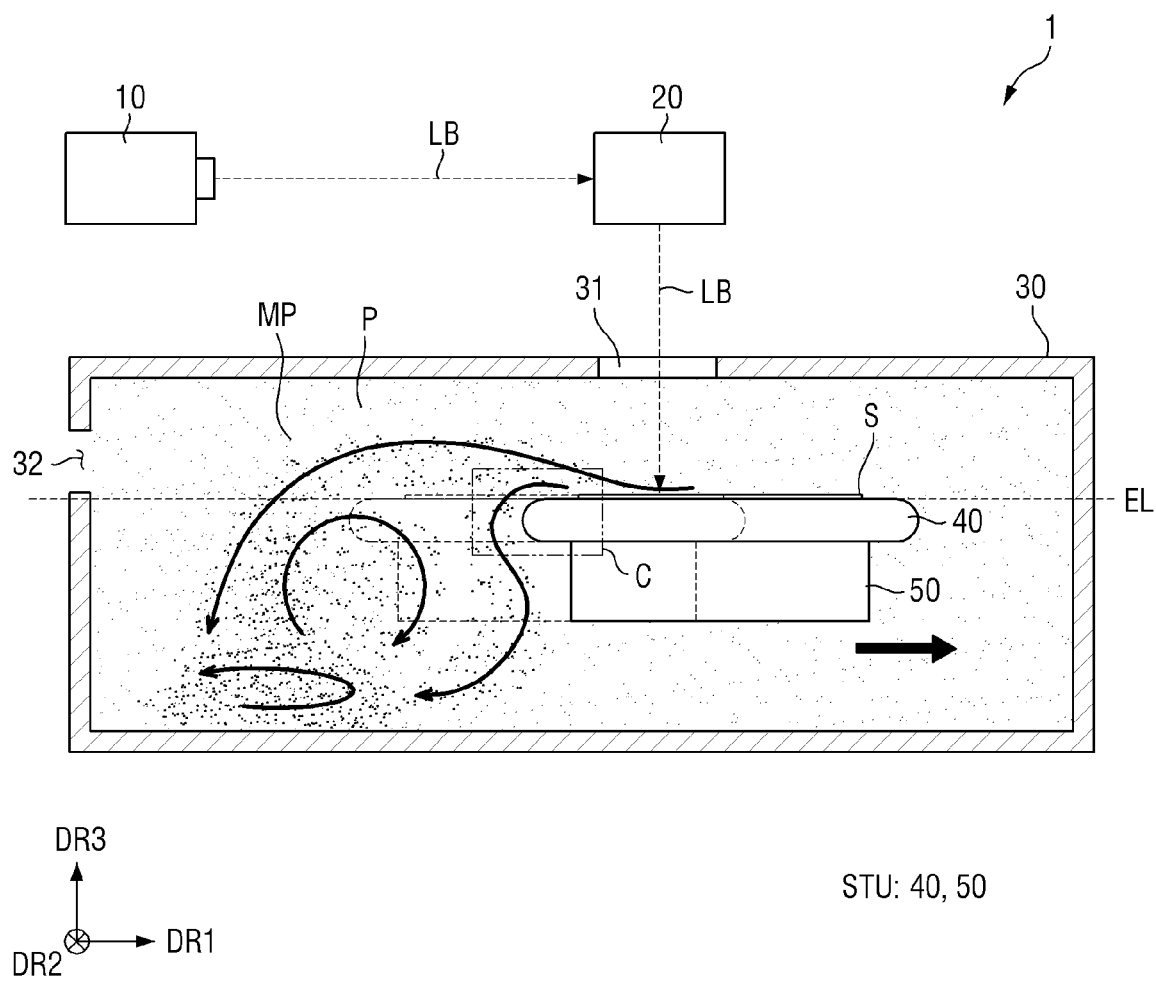
FIG. 10 is a view schematically showing a flow of particles and fine particles with the movement of a stage.
Figure 11:
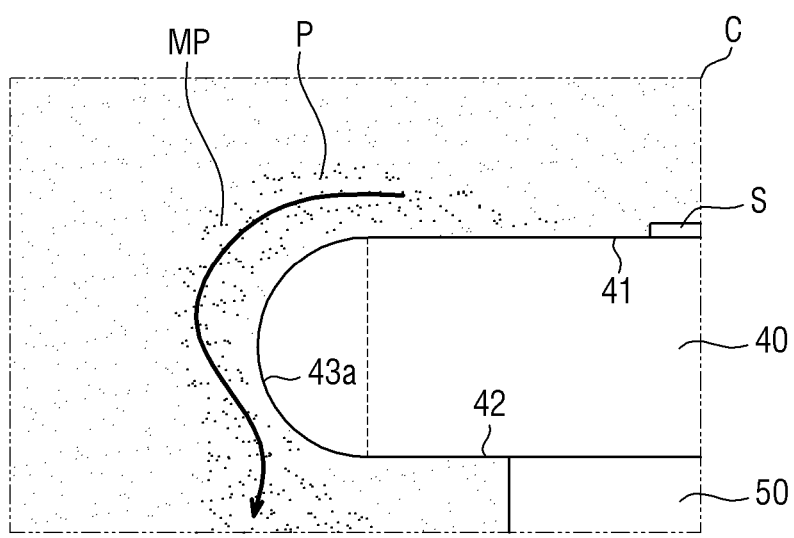
FIG. 11 is an enlarged schematic view of region C of FIG. 10.

FIG. 8 is a view schematically showing particles and fine particles located inside a chamber. FIG. 9 is an enlarged schematic view of region B of FIG. 8. FIG. 10 is a view schematically showing the flow of particles and fine particles with the movement of a stage. FIG. 11 is an enlarged schematic view of region C of FIG. 10. FIGS. 8 and 9 show a process of forming fine particles by a laser beam, and FIGS. 10 and 11 show a process in which particles and fine particles flow down the stage by the Coanda effect.

First, referring to FIGS. 8 and 9, as described above, particles P may be located in the chamber 30. Particles P may be very small in size and very light. The inside of the chamber 30 which may be an enclosed space may have a small flow development, and despite the gravity, part of the particles P may float without being accumulated in a lower portion of the chamber 30. For example, part of the particles P may float above the upper surface 41 of the stage 40. The particles P may be deposited on the amorphous silicon thin film and/or the crystallized silicon thin film during the laser irradiation process to contaminate the resultant product of the laser irradiation process.

Some of the particles P located between the stage 40 and the light transmission window 31 may be micronized by the laser beam LB to be divided into fine particles MP. The fine particles MP divided from one particle P may be located in more regions than one particle P, and in more regions, may be deposited on the amorphous silicon thin film and/or the crystallized silicon thin film to contaminate more portions of the resultant product of the laser irradiation process.

For example, the particles P located above the stage 40 may contaminate the resultant product of the laser irradiation process by themselves, and in case the particles P are micronized by the laser beam LB, the resultant product may be contaminated in more regions, e.g., by the fine particles MP.

Referring to FIGS. 10 and 11, the Coanda effect may occur on the upper surface 41 and the first side surface 43a of the stage 40 by the shape of the stage 40 described above. Accordingly, the particles P and the fine particles MP located above the stage 40 may travel toward the bottom of the stage 40.

Hereinafter, a case where the stage 40 moves toward another side (right side in the drawing) of the first direction DR1 will be described, but the same description may also be applied when the stage 40 moves toward a side (left side in the drawing) of the first direction DR1. Further, since the Coanda effect has been sufficiently described in research or patent documents in various technical fields, a detailed description thereof will be omitted.

As the stage 40 moves to another side of the first direction DR1, a downward airflow descending to the bottom of the stage 40 may be formed at one side of the stage 40 in the first direction DR1. In other words, as the stage 40 moves to another side of the first direction DR1, the particles P and the fine particles MP disposed above the stage 40 may relatively move to one side of the first direction DR1. The particles P and the fine particles MP disposed above the stage 40 may move along the upper surface 41 and the first side surface 43a of the stage 40 due to the Coanda effect. Thus, it may generally flow toward the bottom of stage 40.

Due to the downward airflow, the particles P and the fine particles MP may generally flow toward the bottom of the stage 40, not only in a region adjacent to the stage 40, but also in a region separated from the stage 40 by a distance. Further, the downward airflow moving along the upper surface 41 and the first side surface 43a of the stage 40 by the Coanda effect can suppress or prevent the particles P and the fine particles MP, which may be located at the lower side of the chamber 30 or the bottom of the stage 40, from rising by the wake formed by the movement of the stage 40. Although not limited thereto, a proportion of the particles P and the fine particles MP located above the stage 40, i.e., above the imaginary extension line EL extending from the upper surface of the stage 40 may be about 15% or less or about 11% or less of the total particles P and fine particles MP.

The stage 40 (see FIG. 4) may have no edge at the first boundary BD1 (see FIG. 4) and the second boundary BD2 (see FIG. 4) where the upper surface 41 (see FIG. 4) of the stage 40 (see FIG. 4) may meet the first side surface 43a (see FIG. 4) and the second side surface 43b (see FIG. 4) and the first side surface 43a (see FIG. 4) and the second side surface 43b (see FIG. 4) may be rounded. Therefore, it may be possible to reduce the number of the particles P and the fine particles MP located above the stage 40, and also to reduce the contamination that may be caused by the particles P and the fine particles MP. Accordingly, the reliability and yield of the laser irradiation process can be improved.

The manufacturing apparatus described so far may be used for manufacturing a display device, and a manufacturing method of the display device also falls within the scope of the disclosure. Hereinafter, a display device that can be manufactured using the manufacturing apparatus 1 according to an embodiment will be described with reference to FIG. 12.

Figure 12:
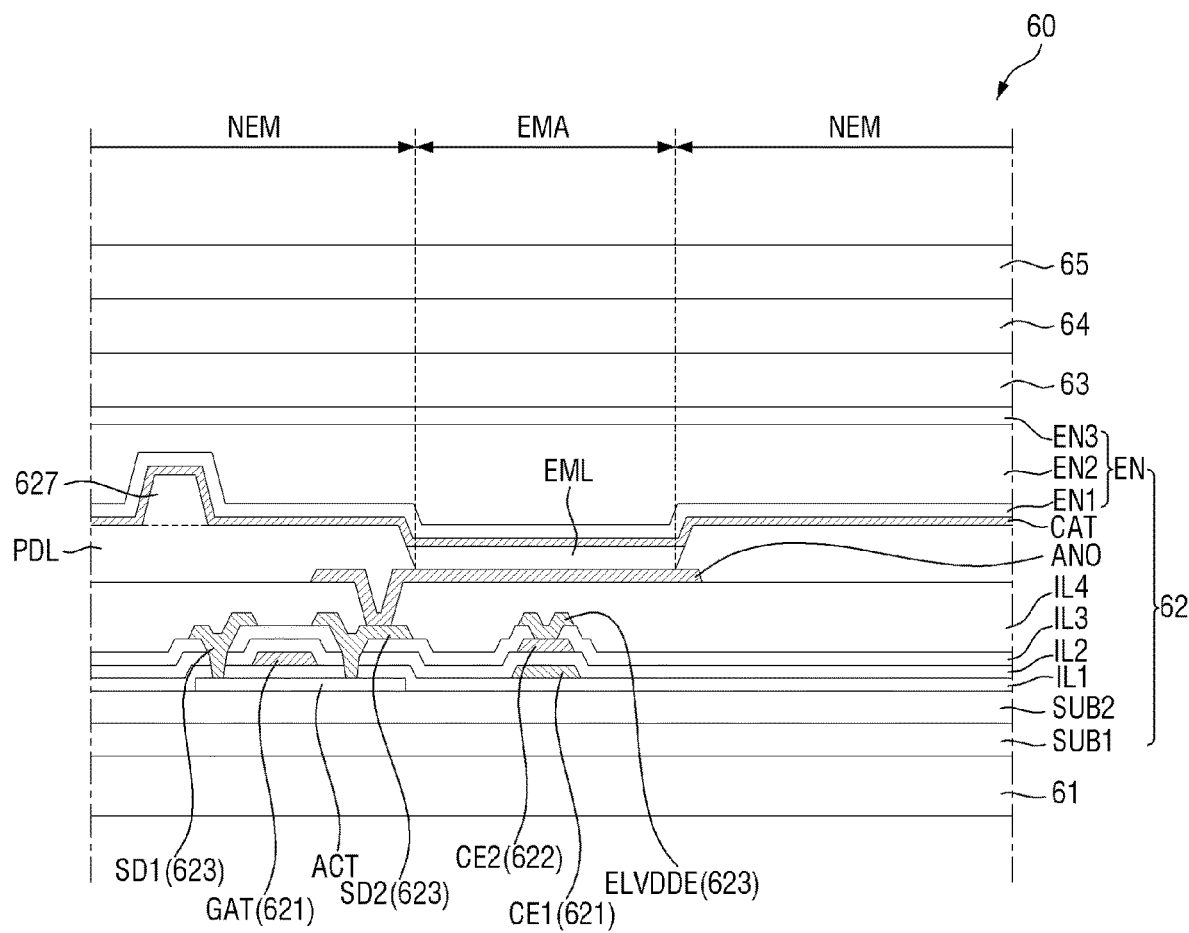
FIG. 12 is a cross-sectional view schematically illustrating a portion of a display device manufactured using the manufacturing apparatus according to an embodiment.

FIG. 12 is a cross-sectional view schematically illustrating a portion of a display device manufactured using the manufacturing apparatus according to an embodiment.

Referring to FIG. 12, a display device 60 manufactured by the manufacturing apparatus 1 (see FIG. 1) according to an embodiment may include a lower member 61, a display panel 62, and a touch member 63, a polarizing member 64 and a cover window 65. The lower member 61, the display panel 62, the touch member 63, the polarizing member 64 and the cover window 65 may be sequentially stacked on each other. At least one coupling member such as an adhesive layer or a tackifying layer may be disposed between the stacked members to couple the adjacent stacked members. However, the disclosure is not limited thereto, and another layer may be further disposed between the respective layers, and some of the stacked members may be omitted.

The display panel 62 may be a panel for displaying a screen or an image. Examples of the display panel may include not only a self-luminous display panel such as an organic light emitting display (OLED) panel, an inorganic electroluminescence (EL) display panel, a quantum dot (QED) display panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel. Hereinafter, the organic light emitting display panel will be described as an example of the display panel, and the organic light emitting display panel applied to the embodiment will be simply referred to as the display panel 62 unless special distinction is required. However, the embodiment is not limited to the organic light emitting display panel, and other display panels mentioned above or known in the art may be applied within the scope of the same technical ideas.

The display panel 62 may include a base substrate SUB1, a buffer layer SUB2, a semiconductor layer ACT, a first insulating layer ILL a first gate conductive layer 621, a second insulating layer IL2, a second gate conductive layer 622, a third insulating layer IL3, a data conductive layer 623, a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and a thin film encapsulation layer EN disposed on the cathode electrode CAT. Each of the layers described above may consist of a single layer, or a stack of multiple layers. Other layers may be further disposed between the layers.

The base substrate SUB1 may support respective layers disposed thereon. The base substrate SUB1 may be made of an insulating material such as a polymer resin or an inorganic material such as glass or quartz.

The buffer layer SUB2 may be disposed on the base substrate SUB1. The buffer layer SUB2 may include silicon nitride, silicon oxide, silicon oxynitride, or the like.

The semiconductor layer ACT may be disposed on the buffer layer SUB2. The semiconductor layer ACT forms a channel of a thin film transistor of a pixel. As described above, the semiconductor layer ACT may include polycrystalline silicon obtained by crystallizing amorphous silicon included in the amorphous silicon thin film by the manufacturing apparatus 1 (see FIG. 1). The semiconductor layer ACT may be obtained by crystallizing and patterning all of the amorphous silicon disposed over the entire region of the target substrate S (see FIG. 3) and/or the entire region of the element area TA (see FIG. 3), or may be obtained by first patterning the amorphous silicon thin film and then crystallizing the patterned amorphous silicon thin film. However, the disclosure is not limited thereto, and although not illustrated, by crystallizing only a portion of the amorphous silicon thin film, the semiconductor layer ACT may include an amorphous silicon region (not shown) in which amorphous silicon is disposed and a polycrystalline silicon region (not shown) in which polycrystalline silicon is disposed.

The first insulating layer IL1 may be disposed on the semiconductor layer ACT. The first insulating layer IL1 may be a gate insulating layer having a gate insulating function.

The first gate conductive layer 621 may be disposed on the first insulating layer IL1. The first gate conductive layer 621 may include a gate electrode GAT of the thin film transistor of the pixel, a scan line connected thereto and a first electrode CE1 of a storage capacitor.

The second insulating layer IL2 may be disposed on the first gate conductive layer 621. The second insulating layer IL2 may be an interlayer insulating layer or a second gate insulating layer.

The second gate conductive layer 622 may be disposed on the second insulating layer IL2. The second gate conductive layer 622 may include a second electrode CE2 of the storage capacitor.

The third insulating layer IL3 may be disposed on the second gate conductive layer 622. The third insulating layer IL3 may be an interlayer insulating layer.

The data conductive layer 623 may be disposed on the third insulating layer IL3. The data conductive layer 623 may include a first electrode SD1, a second electrode SD2 and a first power line ELVDDE of the thin film transistor of the pixel. The first electrode SD1 and the second electrode SD2 of the thin film transistor may be electrically connected to a source region and a drain region of the semiconductor layer ACT via contact holes passing through the third insulating layer IL3, the second insulating layer IL2 and the first insulating layer IL1.

The fourth insulating layer IL4 may be disposed on the data conductive layer 623. The fourth insulating layer IL4 covers the data conductive layer 623. The fourth insulating layer IL4 may be a via layer.

The anode electrode ANO may be disposed on the fourth insulating layer IL4. The anode electrode ANO may be a pixel electrode provided for each pixel. The anode electrode ANO may be electrically connected to the second electrode SD2 of the thin film transistor via the contact hole passing through the fourth insulating layer IL4.

The anode electrode ANO may have a stacked structure formed by stacking a material layer having a high work function, such as indium tin oxide (ITO), indium zinc oxide (IZO), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EML. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL may be disposed on the anode electrode ANO and may include an opening exposing the anode electrode ANO. Emission areas EMA and non-emission areas NEM may be distinguished by the pixel defining layer PDL and the openings of the pixel defining layer PDL.

A spacer 627 may be disposed on the pixel defining layer PDL. The spacer 627 may serve to maintain a gap with a structure disposed thereabove.

The light emitting layer EML is disposed on the anode electrode ANO exposed by the pixel defining layer PDL. The light emitting layer EML may include an organic material layer. The organic material layer of the light emitting layer may include an organic light emitting layer, and may further include a hole injecting/transporting layer and/or an electron injecting/transporting layer.

The cathode electrode CAT may be disposed on the light emitting layer EML. The cathode electrode CAT may be a common electrode disposed over the entire surface without distinguishing the pixels. Each of the anode electrode ANO, the light emitting layer EML and the cathode electrode CAT may constitute an organic light emitting element.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer disposed on the material layer having a low work function.

The thin film encapsulation layer EN may include a first inorganic film EN1, a first organic film EN2 and a second inorganic film EN3, and may be disposed on the cathode electrode CAT. The first inorganic film EN1 and the second inorganic film EN3 may be in contact with each other at an end portion of the thin film encapsulation layer EN. The first organic film EN2 may be encapsulated by the first inorganic film EN1 and the second inorganic film EN3.

Each of the first inorganic film EN1 and the second inorganic film EN3 may include silicon nitride, silicon oxide, silicon oxynitride, or the like. The first organic film EN2 may include an organic insulating material.

The touch member 63 may be disposed on the display panel 62. The touch member 63 may sense a touch input. The touch member 63 may be provided as a panel or a film separate from the display panel 62 as illustrated, and may be attached onto the display panel 62, but the touch member 63 may be provided in the form of a touch layer inside the display panel 62.

The polarizing member 64 may be disposed on the touch member 63. The polarizing member 64 polarizes the light passing therethrough. The polarizing member 64 may serve to reduce the reflection of external light.

The cover window 65 may be disposed on the touch member 63. The cover window 65 serves to cover and protect the display panel 62. The cover window 65 may be made of a transparent material. The cover window 65 may include, for example, glass, plastic, or a combination thereof.

The lower member 61 may be disposed below the display panel 62. The lower member 61 may perform a light blocking function. For example, the lower member 61 may block light from entering the display panel 62 from the outside. Further, the lower member 61 may perform a shock absorbing function beyond the light blocking function.

Hereinafter, other embodiments of the manufacturing apparatus will be described. In the following embodiments, a description of the same components as those of the above-described embodiment will be omitted or simplified, and differences will be described.

Figure 13:
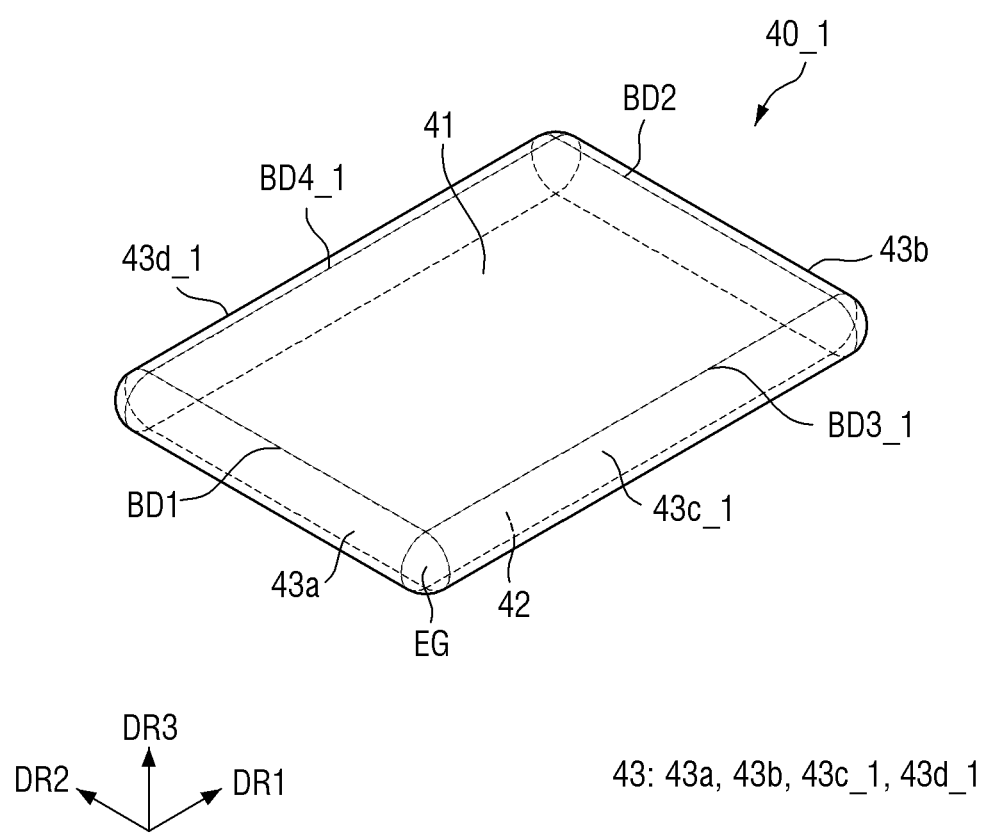
FIG. 13 is a schematic perspective view of a stage according to another embodiment.

FIG. 13 is a schematic perspective view of a stage according to another embodiment.

Referring to FIG. 13, the embodiment is different from the embodiment of FIG. 4 in that among the four side surfaces 43a, 43b, 43c_1 and 43d_1 of a stage 40_1, third and fourth side surfaces 43c_1 and 43d_1, which are disposed on a side and another side of the stage 40_1 in the second direction DR2, may be formed in a round shape.

Specifically, in the stage 40_1 of the embodiment, among the four side surfaces 43a, 43b, 43c_1 and 43d_1 of the stage 40_1, not only the first and second side surfaces 43a and 43b disposed on a side and another side of the stage 40_1 in the first direction DR1, but also the third side surface 43c_1 and the fourth side surface 43d_1 disposed on a side and another side of the stage 40_1 in the second direction DR2 may protrude outward from the stage 40_1 and be formed in a round shape. Further, although not shown, similarly to the first side surface 43a and the second side surface 43b, the third side surface 43c_1 and the fourth side surface 43d_1 may be formed in a shape of a portion of the circumference of a circle in cross-sectional view.

The four side surfaces 43a, 43b, 43c_1 and 43d_1 formed in a round shape may be extended to each other by corner portions EG disposed between the four side surfaces 43a, 43b, 43c_1 and 43d_1. The corner portions EG may be disposed between the four side surfaces 43a, 43b, 43c_1 and 43d_1. The corner portion EG may also protrude outward from the stage 40_1 and be formed in a round shape. The round shape of the corner portion EG may correspond to the round shape of the four side surfaces 43a, 43b, 43c_1 and 43d_1.

Portions where the third side surface 43c_1 and the fourth side surface 43d_1 meet the upper surface 41 of the stage 40_1 may be referred to as a third boundary BD3_1 and a fourth boundary BD4_1, respectively. The stage 40_1 may have no edge at the third boundary BD3_1 and the fourth boundary BD4_1.

Foreign matter inside the chamber 30 (see FIG. 1) can be controlled by the downward airflow according to the movement of the stage 40_1 due to the Coanda effect, thereby improving the reliability and yield of the laser irradiation process. In the embodiment, even in case the stage 40_1 moves not only in the first direction DR1 but also in the second direction DR2, foreign matter inside the chamber 30 (see FIG. 1) can be controlled by the downward airflow due to the Coanda effect, thereby further improving the reliability and yield of the laser irradiation process.

Figure 14:
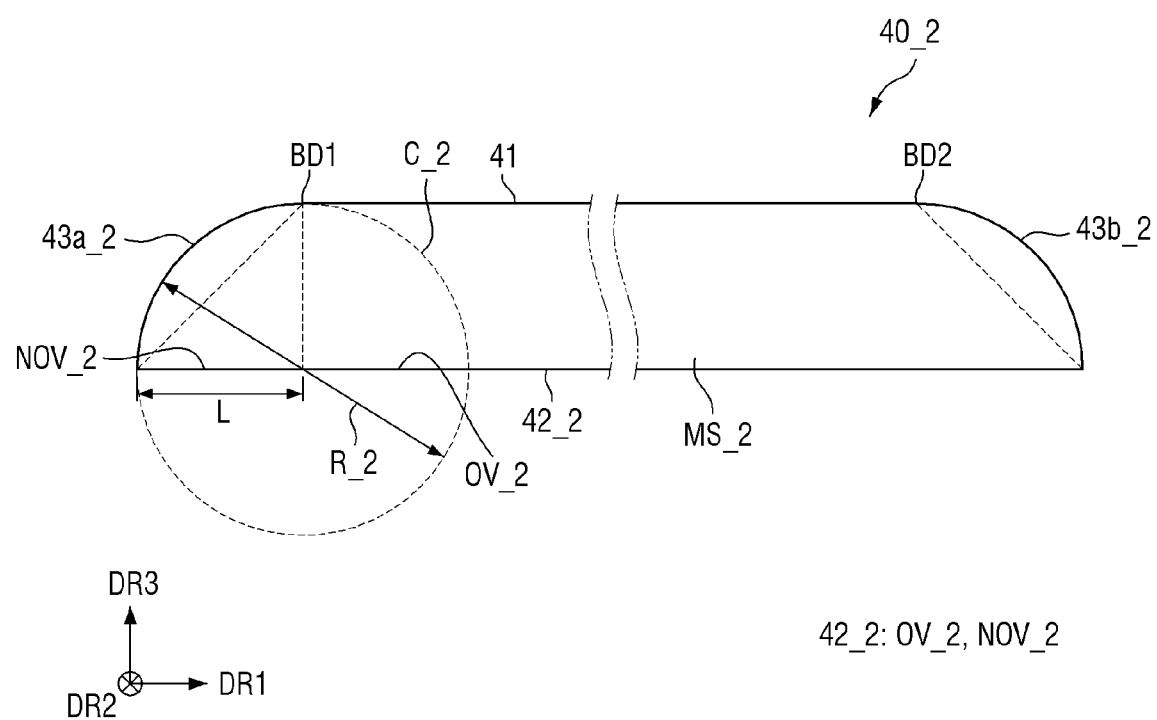
FIG. 14 is a schematic cross-sectional view of a stage according to still another embodiment.

FIG. 14 is a schematic cross-sectional view of a stage according to still another embodiment.

Referring to FIG. 14, the embodiment is different from the embodiment of FIG. 5 in that a lower surface 42_2 of a stage 40_2 does not have the same shape and size as the upper surface 41.

Specifically, the lower surface 42_2 of the stage 40_2 according to the embodiment may include a first region OV_2 overlapping the upper surface 41 in the third direction DR3, and a second region NOV_2 extending from the first region OV_2 to a side and another side of the first direction DR1 and protruding outward from the stage 40_2.

Although not limited thereto, a width L of the second region NOV_2 in the first direction DR1 may be the same as the thickness (width in the third direction DR3) of the stage 40_2. Each of a first side surface 43a_2 and a second side surface 43b_2 may be formed as a portion corresponding to one quarter (¼) of the circumference of a circle C_2. Further, the thickness of the stage 40_2 may be about 30 mm or more or about 50 mm or more. A diameter R_2 of the circle C_2 may be about 60 mm or more or about 100 mm or more.

The stage 40_2 may have no edge at the first boundary BD1 and the second boundary BD2, and foreign matter inside the chamber 30 (see FIG. 1) can be controlled by the downward airflow according to the movement of the stage 40_2 due to the Coanda effect, thereby improving the reliability and yield of the laser irradiation process.

Figure 15:
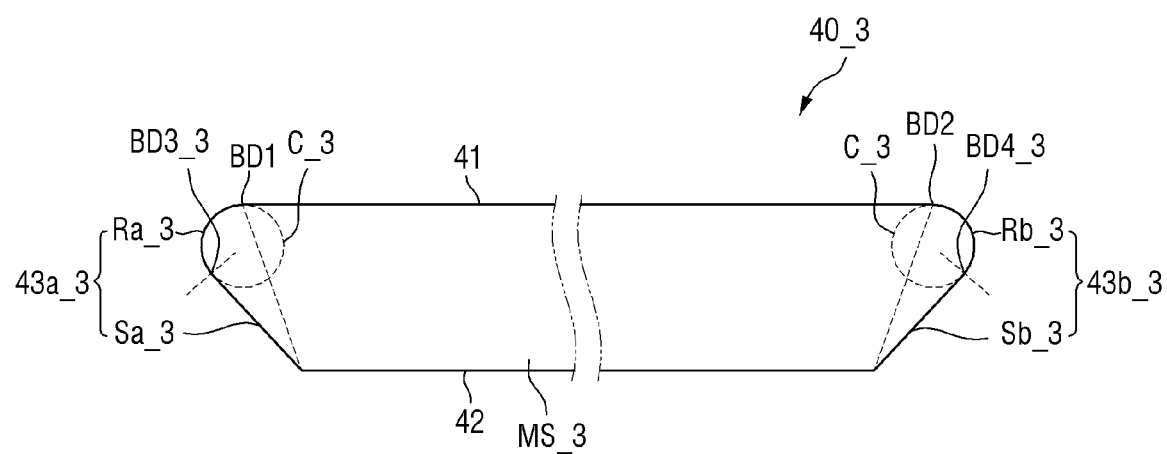
FIG. 15 is a schematic cross-sectional view of a stage according to still another embodiment.

FIG. 15 is a schematic cross-sectional view of a stage according to still another embodiment.

Referring to FIG. 15, the embodiment is different from the embodiment of FIG. 5 in that only a portion of each of a first side surface 43a_3 and a second side surface 43b_3 of a stage 40_3 is formed in a round shape.

Specifically, the first side surface 43a_3 and the second side surface 43b_3 of the stage 40_3 according to the embodiment may include first regions Ra_3 and Rb_3 formed in a round shape and second regions Sa_3 and Sb_3 excluding the first regions Ra_3 and Rb_3, respectively. Each of the first regions Ra_3 and Rb_3 of the first side surface 43a_3 and the second side surface 43b_3 may be formed as a portion of the circumference of a circle C_3, although not limited thereto. Although not limited thereto, the second regions Sa_3 and Sb_3 may have a substantially flat shape.

Boundaries where the first regions Ra_3 and Rb_3 and the second regions Sa_3 and Sb_3 of the first side surface 43a_3 and the second side surface 43b_3 meet are referred to as a third boundary BD3_3 and a fourth boundary BD4_3, respectively. The third boundary BD3_3 and the fourth boundary BD4_3 may be located on the first side surface 43a_3 and the second side surface 43b_3, respectively. A region between the first boundary BD1 and the third boundary BD3_3 may be the first region Ra_3 of the first side surface 43a_3, and a region between the second boundary BD2 and the fourth boundary BD4_3 may be the first region Rb_3 of the second side surface 43b_3. In other words, the first region Ra_3 of the first side surface 43a_3 may be extended to the upper surface 41 at the first boundary BD1, and the first region Rb_3 of the second side surface 43b_3 may be extended to the upper surface 41 at the second boundary BD2. The first region Ra_3 of the first side surface 43a_3 may be extended to the second region Sa_3 of the first side surface 43a_3 at the third boundary BD3_3, and the first region Rb_3 of the second side surface 43b_3 may be extended to the second region Sb_3 of the second side surface 43b_3 at the fourth boundary BD4_3. Further, the second regions Sa_3 and Sb_3 of the first side surface 43a_3 and the second side surface 43b_3 may be extended to the lower surface 42.

The stage 40_3 may have no edge at the first boundary BD1 and the second boundary BD2. Although not limited thereto, the stage 40_3 may have no edge at the third boundary BD3_3 and the fourth boundary BD4_3. Therefore, the stage 40_3 can control foreign matter inside the chamber 30 (see FIG. 1) by the downward airflow according to the movement of the stage 40_3 due to the Coanda effect, thereby improving the reliability and yield of the laser irradiation process.

Figure 16:
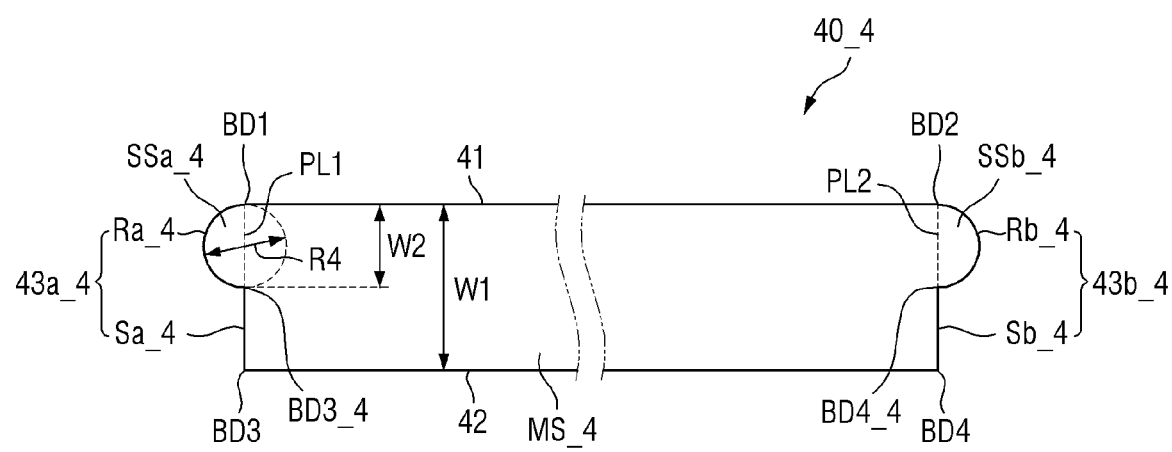
FIG. 16 is a schematic cross-sectional view of a stage according to still another embodiment.
Figure 16:
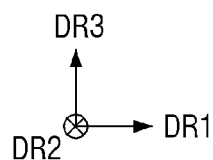

FIG. 16 is a schematic cross-sectional view of a stage according to still another embodiment.

Referring to FIG. 16, the embodiment is different from the embodiment of FIG. 5 in that a thickness W1 (width in the third direction DR3) of a main part MS_4 of a stage 40_4 is different from a thickness W2 (width in the third direction DR3) of first and second sub-parts SSa_4 and SSb_4 of the stage 40_4.

Specifically, the stage 40_4 according to the embodiment may include the main part MS_4, the first sub-part SSa_4 and the second sub-part SSb_4, and the thickness W2 of the first and second sub-parts SSa_4 and SSb_4 may be smaller than the thickness W1 of the main part MS_4. In other words, the first sub-part SSa_4 and the second sub-part SSb_4 may be formed to protrude from the main part MS_4 to a side and another side of the first direction DR1, and protrude from portions of the main part MS_4 on a side and another side of the first direction DR1.

A first side surface 43a_4 and a second side surface 43b_4 of the stage 40_4 may include first regions Ra_4 and Rb_4 formed in a round shape and second regions Sa_4 and Sb_4 formed in a substantially flat shape, respectively. The first regions Ra_4 and Rb_4 of the first side surface 43a_4 and the second side surface 43b_4 may be located outside the main part MS_4 with respect to the first imaginary plane PL1 and the second imaginary plane PL2, respectively. The second regions Sa_4 and Sb_4 of the first side surface 43a_4 and the second side surface 43b_4 may be located on the first imaginary plane PL1 and the second imaginary plane PL2, respectively. The first regions Ra_3 and Rb_4 may have a radius R4.

The stage 40_4 may have no edge at the first boundary BD1 and the second boundary BD2. Therefore, the stage 40_4 can control foreign matter inside the chamber 30 (see FIG. 1) by the downward airflow according to the movement of the stage 40_4 due to the Coanda effect, thereby improving the reliability and yield of the laser irradiation process. In an embodiment, there may be an edge at the third boundary BD3 and the fourth boundary BD4.

Figure 17:
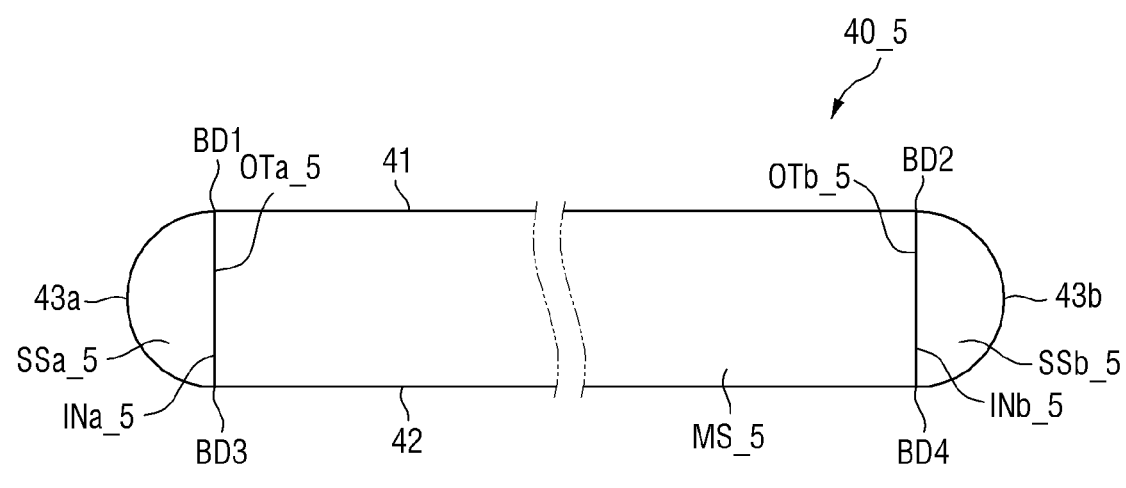
FIG. 17 is a schematic cross-sectional view of a stage according to still another embodiment.
Figure 17:
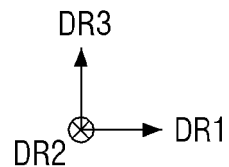

FIG. 17 is a schematic cross-sectional view of a stage according to still another embodiment.

Referring to FIG. 17, the embodiment is different from the embodiment of FIG. 5 in that a stage 40_5 may include a main part MS_5, a first sub-part SSa_5 and a second sub-part SSb_5 which are not integrally formed.

Specifically, the stage 40_5 according to the embodiment includes the main part MS_5, the first sub-part SSa_5 and the second sub-part SSb_5, and the main part MS_5, the first sub-part SSa_5 and the second sub-part SSb_5 may be formed separately, and assembled by being combined with each other.

The side surfaces located on a side and another side of the main part MS_5 in the first direction DR1 are referred to as a first outer surface OTa_5 and a second outer surface OTb_5, respectively. One surface of the first sub-part SSa_5 facing the first outer surface OTa_5 of the main part MS_5 may be referred to as a first inner surface INa_5, and one surface of the second sub-part SSb_5 facing the second outer surface OTb_5 of the main part MS_5 may be referred to as a second inner surface INb_5. The first outer surface OTa_5 and the second outer surface OTb_5 of the main part MS_5 may be in contact with the first inner surface INa_5 of the first sub-part SSa_5 and the second inner surface INb_5 of the second sub-part SSb_5, respectively.

The main part MS_5, the first sub-part SSa_5 and the second sub-part SSb_5 may be coupled to each other by bolt coupling. However, without being limited thereto, they may be coupled to each other, for example, by welding, hook coupling, or bonding using an adhesive member.

The stage 40_5 may have no edge at the first boundary BD1 and the second boundary BD2. Therefore, the stage 40_5 can control foreign matter inside the chamber 30 (see FIG. 1) by the downward airflow according to the movement of the stage 40_5 due to the Coanda effect, thereby improving the reliability and yield of the laser irradiation process.

Figure 18:
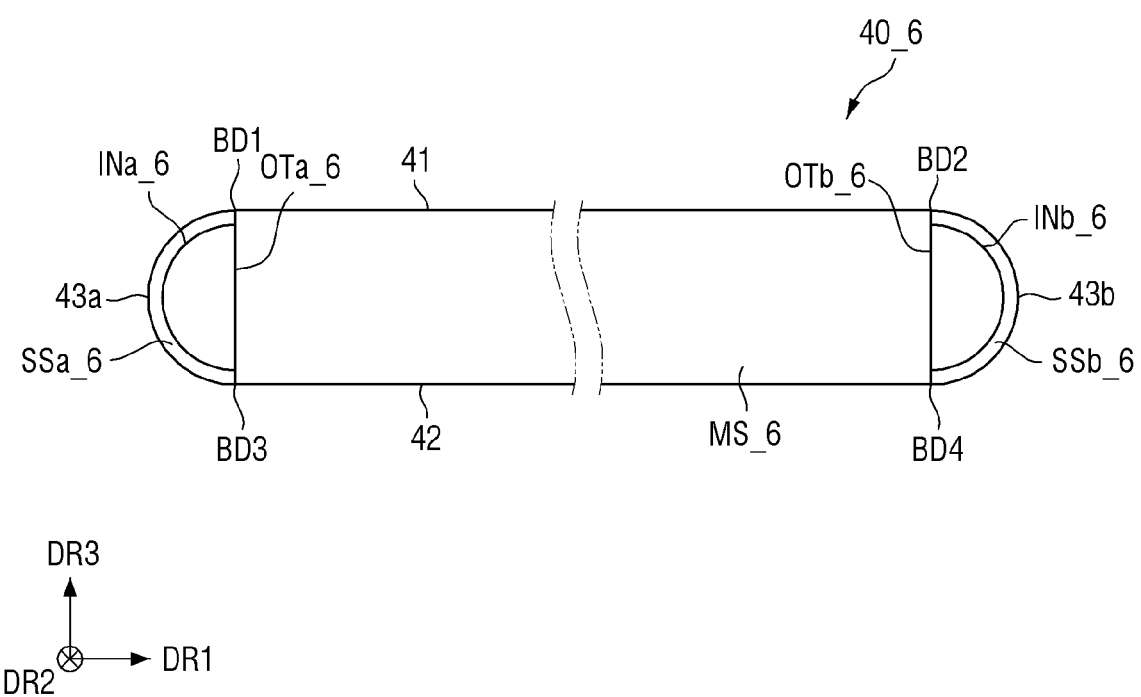
FIG. 18 is a schematic cross-sectional view of a stage according to still another embodiment.

FIG. 18 is a schematic cross-sectional view of a stage according to still another embodiment.

Referring to FIG. 18, the embodiment is different from the embodiment of FIG. 17 in that a stage 40_6 is configured such that a main part MS_6 may be separated by a distance from each of a first sub-part SSa_6 and a second sub-part SSb_6.

Specifically, the stage 40_6 according to the embodiment includes the main part MS_6, the first sub-part SSa_6 and the second sub-part SSb_6, and the components are separately formed and assembled. However, the first sub-part SSa_6 and the second sub-part SSb_6 may cover a first outer surface OTa_6 and a second outer surface OTb_6 of the main part MS_6, and the first outer surface OTa_6 and the second outer surface OTb_6 of the main part MS_6 may be in contact with a portion of a first inner surface INa_6 of the first sub-part SSa_6 and a portion of a second inner surface INa_6 of the second sub-part SSb_6, respectively. Another portion of the first inner surface INa_6 of the first sub-part SSa_6 and another portion of the second inner surface INb_6 of the second sub-part SSb_6 may be separated by a distance from the first outer surface OTa_6 and the second outer surface OTb_6 of the main part MS_6, respectively.

The stage 40_6 may have no edge at the first boundary BD1 and the second boundary BD2. Therefore, the stage 40_6 can control foreign matter inside the chamber 30 (see FIG. 1) by the downward airflow according to the movement of the stage 40_6 due to the Coanda effect, thereby improving the reliability and yield of the laser irradiation process.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A manufacturing method comprising:
    disposing a target substrate on a stage inside a chamber;
    moving the stage; and
    irradiating a laser beam onto a surface of the target substrate,
    wherein the stage includes:
        an upper surface on which the target substrate is mounted;
        a lower surface opposite to the upper surface;
        a first side surface extending between the upper surface and the lower surface in a first direction; and
        a second side surface extending between the upper surface and the lower surface in a second direction perpendicular to the first direction, wherein
    the first side surface is in a round shape, and at least a portion of the first side surface is convex toward an outside of the stage, the round shape of the first side surface causing a downward airflow along the upper surface through the first side surface to below the stage using the Coanda effect.

2. The manufacturing method of claim 1, wherein the target substrate includes an amorphous silicon thin film disposed on the target substrate.

3. The manufacturing method of claim 2, further comprising, after the irradiating of the laser beam, crystallizing at least a portion of the amorphous silicon thin film into crystalline silicon.

4. The manufacturing method of claim 1, wherein
    a slope of a tangent line at an arbitrary point on the first side surface varies as the arbitrary point moves in the second direction, and
    an angle between the tangent line and the upper surface at the arbitrary point increases as the arbitrary point becomes closer to the upper surface in the second direction.

5. The manufacturing method of claim 1, wherein
    the first side surface is in a round shape at a portion where the upper surface and the first side surface meet, and
    an edge is at a portion where the upper surface and the second side surface meet.

6. The manufacturing method of claim 5, wherein an angle between the upper surface and the first side surface at a portion where the upper surface and the first side surface meet is greater than an angle between the upper surface and the second side surface at a portion where the upper surface and the second side surface meet.

* * * * *